United States Patent
Lin et al.

(10) Patent No.: US 12,387,927 B2
(45) Date of Patent: Aug. 12, 2025

(54) DEPOSITION OF BORON FILMS

(71) Applicant: Applied Materials, Inc., Santa Clara, CA (US)

(72) Inventors: Yung-Chen Lin, Gardena, CA (US); Chi-I Lang, Cupertino, CA (US); Ho-yung David Hwang, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 513 days.

(21) Appl. No.: 17/548,689

(22) Filed: Dec. 13, 2021

(65) Prior Publication Data

US 2022/0199401 A1    Jun. 23, 2022

Related U.S. Application Data

(60) Provisional application No. 63/127,256, filed on Dec. 18, 2020.

(51) Int. Cl.
*H01L 21/02* (2006.01)
*C23C 16/04* (2006.01)
(Continued)

(52) U.S. Cl.
CPC ........ *H01L 21/02175* (2013.01); *C23C 16/04* (2013.01); *C23C 16/30* (2013.01);
(Continued)

(58) Field of Classification Search
CPC ......... H01L 21/02175; H01L 21/02205; H01L 21/02274; H01L 21/0228; H01L 21/02356; H01L 21/0332; H01L 21/02439; H01L 21/0254; H01L 21/0262; H01L 21/02642; H01L 21/02112; C23C 16/04; C23C 16/30; C23C 16/45536; C23C 16/45553; C23C 16/042; C23C 16/045; C23C 16/28;
(Continued)

(56) References Cited

U.S. PATENT DOCUMENTS

| 5,043,299 A | 8/1991 | Chang et al. |
| 7,482,691 B2 * | 1/2009 | Joo ........................ H01L 23/485 257/E21.174 |

(Continued)

FOREIGN PATENT DOCUMENTS

TW    201937596 A    9/2019

OTHER PUBLICATIONS

PCT International Search Report and Written Opinion in PCT/US2021/063482 dated Apr. 12, 2022, 9 pages.
(Continued)

*Primary Examiner* — Dale E Page
*Assistant Examiner* — Quovaunda Jefferson
(74) *Attorney, Agent, or Firm* — SERVILLA WHITNEY LLP (57) ABSTRACT

Methods for depositing boron-containing films on a substrate are described. The substrate is exposed to a boron precursor and a plasma to form the boron-containing film (e.g., elemental boron, boron oxide, boron carbide, boron silicide, boron nitride). The exposures can be sequential or simultaneous. The boron-containing films are selectively deposited on one material (e.g., SiN or Si) rather than on another material (e.g., silicon oxide).

19 Claims, 4 Drawing Sheets

(51) Int. Cl.
*C23C 16/30* (2006.01)
*C23C 16/455* (2006.01)

(52) U.S. Cl.
CPC .. *C23C 16/45536* (2013.01); *C23C 16/45553* (2013.01); *H01L 21/02205* (2013.01); *H01L 21/02274* (2013.01); *H01L 21/0228* (2013.01)

(58) Field of Classification Search
CPC . C23C 16/32; C23C 16/342; C23C 16/45542; C23C 16/56; C23C 16/4554
See application file for complete search history.

(56) References Cited

U.S. PATENT DOCUMENTS

| | | | |
|---|---|---|---|
| 7,964,241 B2 | 6/2011 | Hasebe et al. | |
| 9,576,790 B2 | 2/2017 | Pore et al. | |
| 2009/0286402 A1* | 11/2009 | Xia | H01L 21/318 |
| | | | 257/E21.249 |
| 2015/0380302 A1* | 12/2015 | Mountsier | H01L 21/76814 |
| | | | 438/654 |
| 2017/0069527 A1 | 3/2017 | Haukka et al. | |
| 2018/0083104 A1 | 3/2018 | Huang et al. | |
| 2018/0190489 A1 | 7/2018 | Li et al. | |
| 2019/0267282 A1* | 8/2019 | Gstrein | H01L 21/3086 |
| 2020/0051818 A1 | 2/2020 | Aderhold et al. | |
| 2022/0084809 A1* | 3/2022 | Yang | H01L 21/02329 |

OTHER PUBLICATIONS

Kazmi , et al., "Cryogenic Reactive Ion Etching of in-situ Highly Boron Doped LPCVD Poly Si0.3Ge0.7 using SF6 and O2 Plasma", MESA+ Institute for Nanotechnology, University of Twente, 7500 AE Enschede, The Netherlands.

Sprenger, Jaclyn K., et al., "Electron-Enhanced Atomic Layer Deposition of Boron Nitride Thin Films at Room Temperature and 100° C.", J Phys Chem C Nanomater Interfaces. 2018 ; 122(17).

* cited by examiner

DEPOSITION OF BORON FILMS

CROSS-REFERENCE TO RELATED APPLICATIONS

This application claims priority to U.S. Provisional Application No. 63/127,256, filed Dec. 18, 2020, the entire disclosure of which is hereby incorporated by reference herein.

TECHNICAL FIELD

Embodiments of the disclosure relate to semiconductor device manufacturing. More particularly, embodiments of the disclosure are directed to in situ selective deposition of boron-containing films.

BACKGROUND

Boron-containing materials can have a wide variety of uses, including uses in the semiconductor industry. Boron films may have various applications in fabrication processes of semiconductor devices.

As the feature size of the semiconductor device get smaller, the critical dimension (CD) requirement of features becomes a more important criterion for stable and repeatable device performance. Allowable CD variation across a substrate has also scaled with the scaling of feature CD. With lateral dimensions scaling faster than vertical dimensions, because of issues such as device capacitance, high aspect ratios (HAR) are now prevalent in the industry.

Deposition processes that provide boron-containing films which can demonstrate coverage of three-dimensional structures having high aspect ratios are desired. Additionally, boron-containing films are desired that demonstrate an advantageous etch selectivity with respect one or more other materials in the semiconductor device, and/or a desirable etch rate in a dry etch and/or wet etch process.

There is, therefore, a need in the art for methods of selectively depositing boron-containing films.

SUMMARY

One or more embodiments of the disclosure are directed to a method of depositing a film. In one embodiment, a method of depositing a film comprises: exposing a substrate to a boron precursor to deposit a film on the substrate, the substrate comprising a first material and a second material, the film forming selectively on the second material and not on the first material; and exposing the substrate to a plasma to react with the film to form a boron-containing film.

One or more embodiments of the disclosure are directed to a method of depositing a film. In one embodiment, a method of depositing a film comprises: forming a boron-containing film in a process cycle comprising sequential exposure of a substrate to a boron precursor and a reactant, the substrate comprising a first material and a second material, the boron-containing film forming selectively on the second material and not on the first material.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Films comprising can have a variety of desirable properties, including chemical stability, mechanical strength, and thermal and electrical properties. As a result, such films have diverse applications in many technical fields, including applications in the semiconductor, medical, military, space, and nuclear industries. For example, boron carbon films are used as neutron detectors, in the fabrication of semiconductor devices, and in the fabrication of microelectromechanical systems (MEMS). They may be used in tribological coatings for MEMS components and/or as sacrificial films in semiconductor device fabrication processes. In some embodiments, boron-containing films can be used as a cap layer, an etch stop layer, as a layer for facilitating photolithography patterning processes, and/or as a doping layer (e.g., as a boron dopant source). Other uses outside of the semiconductor area will be apparent to the skilled artisan.

In one or more embodiments films comprising boron are disclosed, along with methods for making such films. In other embodiments, boron-containing films can be part of processes for fabricating semiconductor devices. For example, boron-containing films can be deposited on three-dimension (3D) features during semiconductor device fabrication processes. In one or more embodiments, boron-containing films may be used as a spacer material for a transistor gate feature (e.g., as a spacer material of gate features in multi-gate transistors such as FinFETs), and/or as a sacrificial layer in semiconductor device fabrication processes.

As described herein, a boron-containing film can be used in some embodiments as a dopant film in a semiconductor device fabrication process. For example, the boron-containing film can provide a dopant source for a semiconductor substrate, such as a silicon substrate. In some embodiments, boron-containing films can serve as a solid-state diffusion (SSD) layer, where the boron can serve as a dopant. For example, the boron-containing film can be deposited over a substrate and the deposited boron-containing film can subsequently be subjected to an anneal process such that boron from the boron-containing film is driven into the underlying substrate.

One or more embodiments of the disclosure advantageously provide for the selective deposition of boron-containing films on a second material over a first material. For example, selectively depositing boron on silicon over silicon oxide advantageously provides boron layers without additional etch or lithography steps.

Figure 1A:
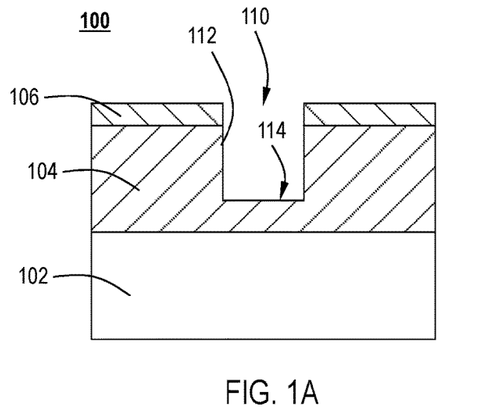
FIGS. 1A and 1B illustrate a cross-sectional view of a substrate according to one or more embodiments.
Figure 1B:
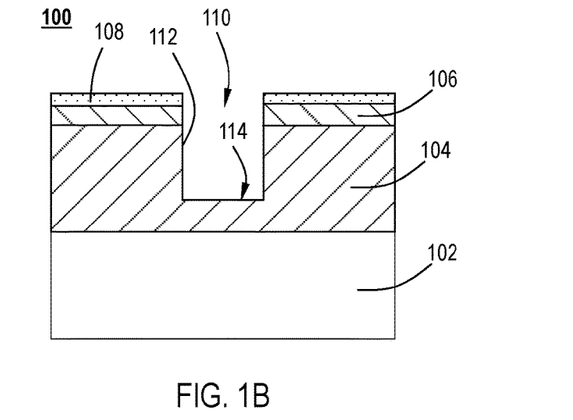

One or more embodiments of the disclosure are directed to processing methods in which a substrate surface with at least one feature thereon is provided. As used in this regard, the term "provided" means that the substrate is placed into a position or environment for further processing. With reference to FIGS. 1A and 1B, selective deposition may also enable high selectivity and high aspect ratio etching in a reactive ion etching (RIE) chamber. In one or more embodiments, a semi-conductor device 100 is provided. The device 100 comprises a substrate 102 with a first material 104 on a top surface of the substrate 102. In some embodiments, the device 100 comprises at least one feature 110. The feature may be selected from one or more of a trench, a via, or a pillar. In some embodiments, the feature 110 comprises a trench having at least one sidewall 112 and a bottom surface 114.

In one or more embodiments, the first material 104 may comprise any suitable material known to the skilled artisan. In one or more embodiments, the first material 104 comprises a metal oxide. In some embodiments, the first material 104 comprises one or more of silicon oxide ($SiO_2$), aluminum oxide ($Al_2O_3$), zirconium oxide ($ZrO_2$), tin oxide ($SnO_x$), hafnium oxide ($HfO_2$), titanium nitride (TiN), tantalum nitride (TaN), and carbon (C). In one or more embodiments, a second material 106 is formed on a top surface of the first material 104. The second material may comprise any suitable material known to the skilled artisan. In some embodiments, the second material comprises one or more of silicon (Si) and silicon nitride (SiN).

In one or more embodiments, a boron-containing layer 108 is selectively deposited on a top surface of the second material 106 and does not form on the first material 104.

Figure 2A:
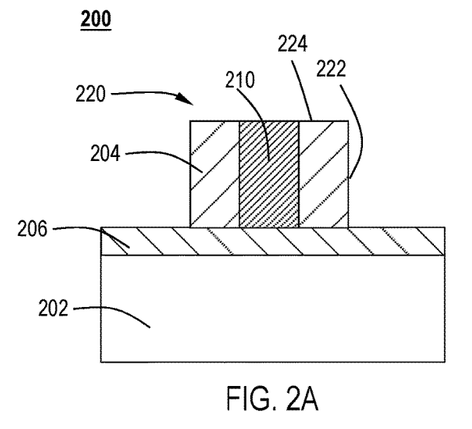
FIGS. 2A and 2B illustrate a cross-sectional view of a substrate according to one or more embodiments.
Figure 2B:
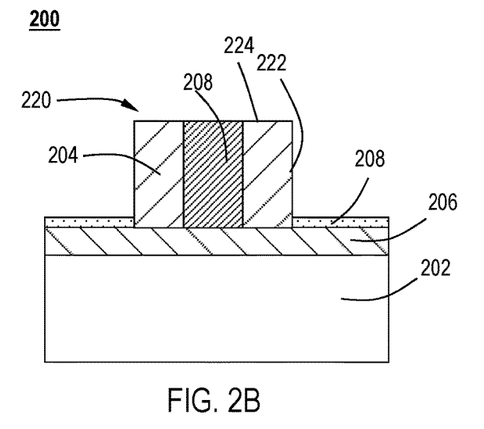

In one or more embodiments, selective deposition of boron-containing films may advantageously reduce the stoplayer loss during spacer etch processes. With reference to FIGS. 2A and 2B, in one or more embodiments, a semi-conductor device 200 is provided. The device 200 comprises a substrate 202 with a second material 206 on a top surface of the substrate 202. In some embodiments, the device 200 comprises at least one feature 220. The feature 220 may be selected from one or more of a trench, a via, or a pillar. In some embodiments, the feature 220 comprises a pillar having at least one sidewall 222 and a top surface 224.

In one or more embodiments, the pillar 220 comprises a carbon layer 210 surrounded by a first material 204. In some embodiments, the feature 220 is a spacer.

In one or more embodiments, the first material 204 may comprise any suitable material known to the skilled artisan. In one or more embodiments, the first material 204 may comprise a metal oxide. In some embodiments, the first material 204 comprises one or more of silicon oxide ($SiO_2$), aluminum oxide ($Al_2O_3$), zirconium oxide ($ZrO_2$), tin oxide ($SnO_x$), hafnium oxide ($HfO_2$), titanium nitride (TiN), and tantalum nitride (TaN). In one or more embodiments, the second material 206 may comprise any suitable material known to the skilled artisan. In some embodiments, the second material 206 comprises one or more of silicon (Si) and silicon nitride (SiN).

In one or more embodiments, a boron-containing layer 208 is selectively deposited on a top surface of the second material 206 and does not form on the first material 204.

Figure 3A:
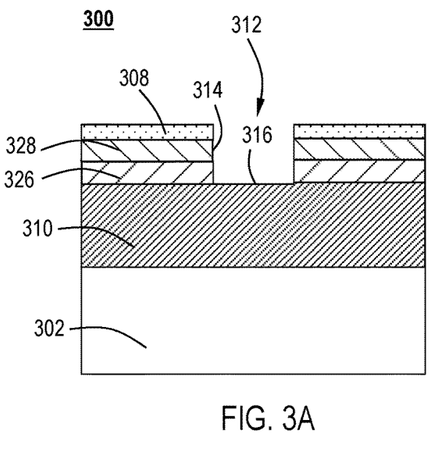
FIGS. 3A and 3B illustrate a cross-sectional view of a substrate according to one or more embodiments.
Figure 3B:
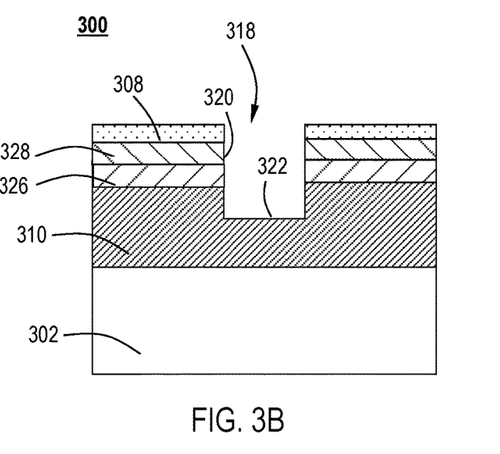

In one or more embodiments, boron-containing films can be tuned to selectively deposit on a top surface of a hardmask only, and not in a trench on a substrate. Such selective deposition can be used to protect the hardmask or top structure to achieve selective etch in a high aspect ratio structure. Referring to FIGS. 3A and 3B, in one or more embodiments, a semi-conductor device 300 is provided. The device 300 comprises a substrate 302 with a carbon layer 310 formed on a top surface of the substrate 302. A first hardmask layer 326 is formed on a top surface of the carbon layer 310, and a second hardmask layer 328 is formed on a top surface of the first hardmask layer 326. The first hardmask layer 326 and the second hardmask layer 328 may comprise any suitable material known to the skilled artisan.

In some embodiments, the device 300 comprises at least one feature 312. The feature may be selected from one or more of a trench, a via, or a pillar. In some embodiments, the feature 312 comprises a trench having at least one sidewall 314 and a bottom surface 316. In one or more embodiments, a boron-containing layer 308 is formed on a top surface of the second hardmask layer 328 and not on the carbon layer 310. Referring to FIG. 3B, the boron-containing film 308 protects the second hardmask layer 328 (and the top of the device 300) such that selective etching is achieved in a high aspect ratio structure, resulting in a feature 318 having at least one sidewall 320 and a bottom surface 322. In one or more embodiments, the feature 318 has a depth that is greater than the depth of the feature 312.

Figure 4A:
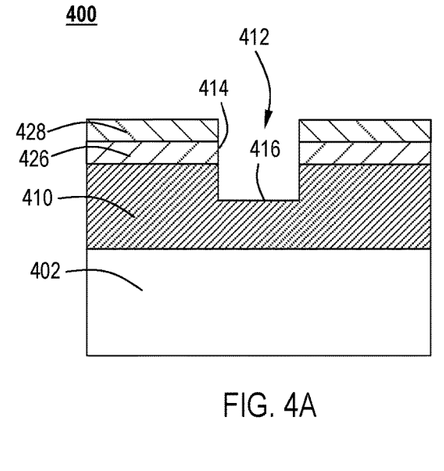
FIGS. 4A and 4B illustrate a cross-sectional view of a substrate according to one or more embodiments.
Figure 4B:
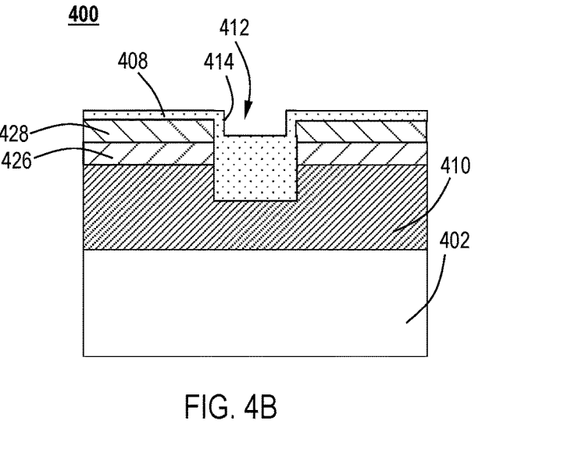

In one or more embodiments, bottom-up deposition can be achieved to create a large difference in the thickness in the feature versus the thickness of the boron-containing layer on the top surface of a device. Referring to FIGS. 4A and 4B, in one or more embodiments, a semi-conductor device 400 is provided. The device 400 comprises a substrate 402 with a carbon layer 410 formed on a top surface of the substrate 402. A first hardmask layer 426 is formed on a top surface of the carbon layer 410, and a second hardmask layer 428 is formed on a top surface of the first hardmask layer 426. The first hardmask layer 426 and the second hardmask layer 428 may comprise any suitable material known to the skilled artisan.

In some embodiments, the device 400 comprises at least one feature 412. The feature may be selected from one or more of a trench, a via, or a pillar. In some embodiments, the feature 412 comprises a trench having at least one sidewall 414 and a bottom surface 416. Referring to FIG. 4B, in one or more embodiments, a boron-containing layer 408 is formed on a top surface of the second hardmask layer 428 and as a gap-fill material in the at least one feature 412. Referring to FIG. 4B, bottom-up deposition of the boron-containing film 408 can be achieved to create large difference between the thickness of the boron-containing film 408 in the at least one feature 412 and on the top surface of the second hardmask 428.

Figure 5:
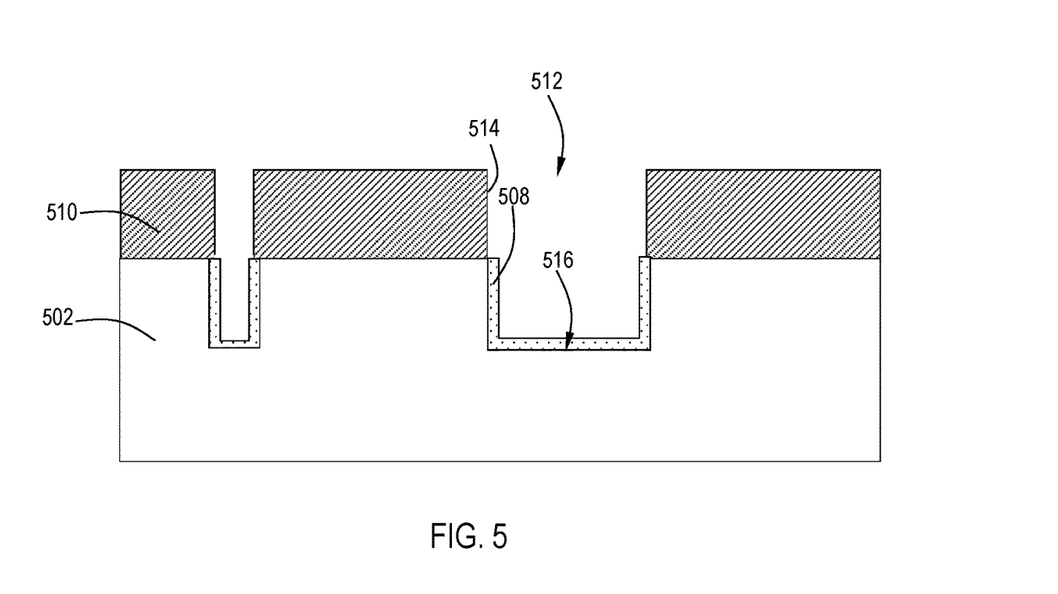
FIG. 5 illustrates a cross-sectional view of a substrate according to one or more embodiments.

In one or more embodiments, selective deposition or bottom-up deposition on silicon improves the loading between iso/dense. In the open area, the deposition is slightly thicker. Sidewall deposition can reduce the bowing in high aspect ratio etching. With reference to FIG. 5, in one or more embodiments, a semi-conductor device 500 is provided. The device 500 comprises a substrate 502 with a hardmask layer 510 formed on a top surface of the substrate 502. The hardmask layer 510 may comprise any suitable material known to the skilled artisan.

In some embodiments, the device 500 comprises at least one feature 512. The feature may be selected from one or more of a trench, a via, or a pillar. In some embodiments, the feature 512 comprises a trench having at least one sidewall 514 and a bottom surface 516. Referring to FIG. 5, in one or more embodiments, a boron-containing layer 508 is formed in the at least one feature 512 and not on the hardmask layer 510.

Figure 6A:
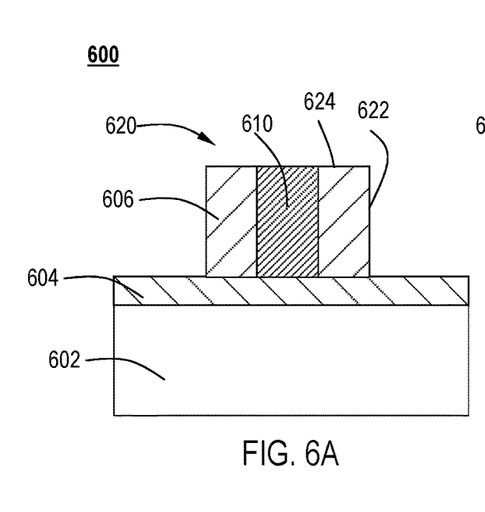
FIGS. 6A and 6B illustrate a cross-sectional view of a substrate according to one or more embodiments.
Figure 6B:
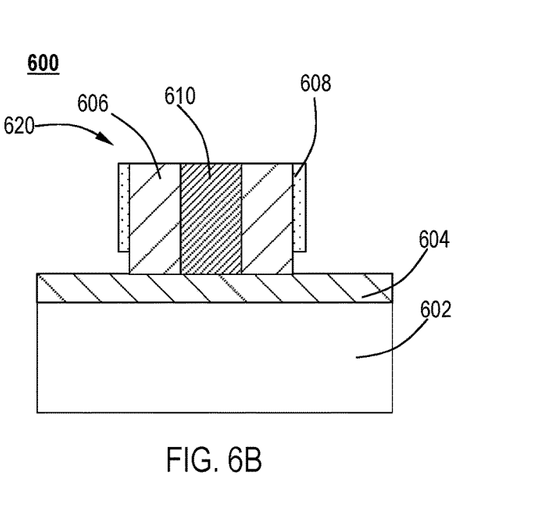

The boron-containing film of one or more embodiments may be used to protect the sidewall of a feature to achieve a substantially square spacer and excellent critical dimension control. Referring to FIGS. 6A and 6B, in one or more embodiments, a semi-conductor device 600 is provided. The device 600 comprises a substrate 602 with a first material 604 on a top surface of the substrate 602. In some embodiments, the device 600 comprises at least one feature 620. The feature 620 may be selected from one or more of a trench, a via, or a pillar. In some embodiments, the feature 620 comprises a pillar having at least one sidewall 622 and a top surface 624.

In one or more embodiments, the pillar 620 comprises a carbon layer 610 surrounded by a second material 606. In some embodiments, the feature 620 is a spacer.

In one or more embodiments, the first material 604 may comprise any suitable material known to the skilled artisan. In one or more embodiments, the first material 604 may comprise a metal oxide. In some embodiments, the first material 604 comprises one or more of silicon oxide ($SiO_2$), aluminum oxide ($Al_2O_3$), zirconium oxide ($ZrO_2$), tin oxide ($SnO_x$), hafnium oxide ($HfO_2$), titanium nitride (TiN), tantalum nitride (TaN), and carbon (C). In one or more embodiments, the second material 606 may comprise any suitable material known to the skilled artisan. In some embodiments, the second material 606 comprises one or more of silicon (Si) and silicon nitride (SiN).

In one or more embodiments, a boron-containing layer 608 is selectively deposited on the second material 606 and does not form on the first material 604.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap.

As used in this specification and the appended claims, the terms "precursor," "reactant," "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. As used in this specification and the appended claims, the terms "reactive compound," "reactive gas," "reactive species," "precursor," "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed sequentially to the two or more reactive compounds which are introduced into a reaction zone of a processing chamber. In a time-domain ALD process, exposure to each reactive compound is separated by a time delay to allow each compound to adhere and/or react on the substrate surface. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness.

Boron (B) can be grown by atomic layer deposition or chemical vapor deposition for many applications. One or more embodiments of the disclosure advantageously provide processes for atomic layer deposition or chemical vapor deposition to form boron-containing films. As used in this specification and the appended claims, the term "boron-containing film" refers to a film that comprises boron atoms and has greater than or equal to about 1 atomic % boron, greater than or equal to about 2 atomic % boron, greater than or equal to about 3 atomic % boron, greater than or equal to about 4 atomic % boron, greater than or equal to about 5 atomic % boron, greater than or equal to about 10 atomic % boron, greater than or equal to about 15 atomic % boron, greater than or equal to about 20 atomic % boron, greater than or equal to about 25 atomic % boron, greater than or equal to about 30 atomic % boron, greater than or equal to about 35 atomic % boron, greater than or equal to about 40 atomic % boron, greater than or equal to about 45 atomic % boron, greater than or equal to about 50 atomic % boron, or greater than or equal to about 60 atomic % boron. In some embodiments, the boron-containing film comprises one or more of boron metal (elemental boron), boron carbon (BC), or boron nitride (BN). The skilled artisan will recognize that the use of molecular formula like BN does not imply a specific stoichiometric relationship between the elements but merely the identity of the major components of the film. For example, BN refers to a film whose major composition comprises boron and nitrogen atoms. In some embodiments, the major composition of the specified film (i.e., the sum of the atomic percents of the specified atoms) is greater than or equal to about 95%, 98%, 99% or 99.5% of the film, on an atomic basis.

Figure 7:
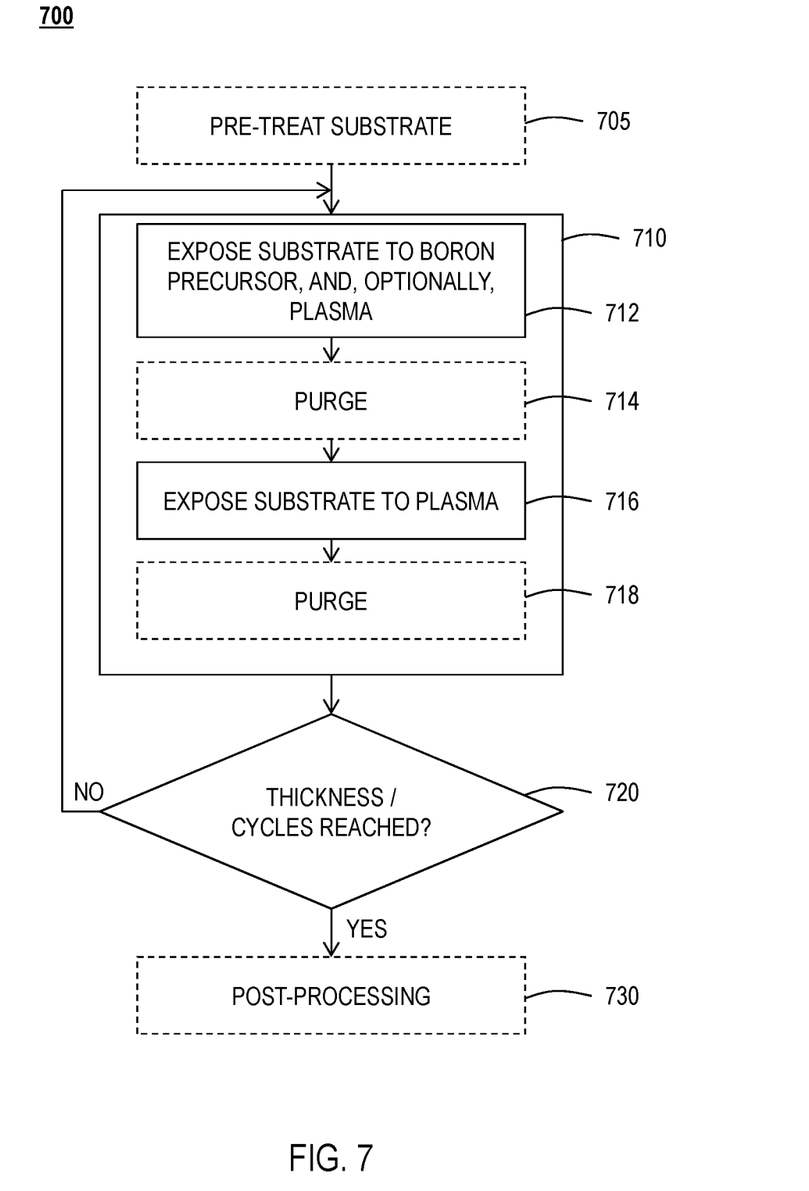
FIG. 7 illustrates a process flow diagram of a method in accordance with one or more embodiments of the disclosure.

With reference to FIG. 7, one or more embodiments of the disclosure are directed to method 700 of depositing a film. The method illustrated in FIG. 7 is representative of an atomic layer deposition (ALD) process in which the substrate or substrate surface is exposed sequentially to the reactive gases in a manner that prevents or minimizes gas phase reactions of the reactive gases. In some embodiments, the method comprises a chemical vapor deposition (CVD) process in which the reactive gases are mixed in the processing chamber to allow gas phase reactions of the reactive gases and deposition of the thin film.

In some embodiments, the method 700 includes a pre-treatment operation 705. The pre-treatment can be any suitable pre-treatment known to the skilled artisan. Suitable pre-treatments include, but are not limited to, pre-heating, cleaning, soaking, native oxide removal, or deposition of an adhesion layer (e.g., titanium nitride (TiN)). In one or more embodiments, an adhesion layer, such as titanium nitride, is deposited at operation 705.

At deposition 710, a process is performed to deposit a boron-containing film on the substrate (or substrate surface). The deposition process can include one or more operations to form a film on the substrate. In operation 712, the substrate (or substrate surface) is exposed to a boron precursor to deposit a film on the substrate (or substrate surface). The boron precursor can be any suitable boron-containing compound that can react with (i.e., adsorb or chemisorb onto) the substrate surface to leave a boron-containing species on the substrate surface. In some embodiments, operation 712 includes gas phase adsorption. In some embodiments, operation 712 is a plasma enhanced process, so a plasma is included.

In one or more embodiments, the boron precursor comprises a boron halide. As used herein, the term "halide" refers to a binary phase, of which one part is a halogen atom and the other part is an element or radical that is less electronegative than the halogen, to make a fluoride, chloride, bromide, iodide, or astatide compound. A halide ion is a halogen atom bearing a negative charge. As known to those of skill in the art, a halide anion includes fluoride (F—), chloride (Cl—), bromide (Br—), iodide (I—), and astatide (At—).

In one or more embodiments, the boron halide is selected from the group consisting of boron trichloride ($BCl_3$), boron trifluoride ($BF_3$), and boron tribromide ($BBr_3$).

As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the deposition of the boron-containing layer, for example, by polishing, etching, reduction, oxidation, halogenation, hydroxylation, annealing, baking, or the like.

The substrate may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, one or more additional layers may be disposed on the substrate such that the boron-containing layer may be at least partially formed thereon. For example, in some embodiments, a layer comprising a metal, a nitride, an oxide, or the like, or combinations thereof may be disposed on the substrate and may have the boron containing layer formed upon such layer or layers.

At operation 714, the processing chamber is optionally purged to remove unreacted boron precursor, reaction products and by-products. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the boron precursor by any suitable technique including, but not limited to, moving the substrate through a gas curtain to a portion or sector of the processing chamber that contains none or substantially none of the boron precursor. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur. In one or more embodiments, the purge gas is selected from one or more of nitrogen ($N_2$), helium (He), and argon (Ar).

At operation 716, the substrate (or substrate surface) is exposed to a plasma to form one or more of a boron-containing film on the substrate. The reactant can react with the boron-containing species on the substrate surface to form the boron-containing film. In one or more embodiments, the plasma comprises one or more of nitrogen ($N_2$), argon (Ar), helium (He), hydrogen ($H_2$), carbon monoxide (CO), carbon dioxide ($CO_2$) methane ($CH_4$), and ammonia ($NH_3$). In some embodiments, the plasma is a remote plasma. In other embodiments, the plasma is a direct plasma.

In one or more embodiments, the plasma may be generated remotely or within the processing chamber. In one or more embodiments, the plasma is an inductively coupled plasma (ICP) or a conductively coupled plasma (CCP). Any suitable power can be used depending on, for example, the reactants, or the other process conditions. In some embodiments, the plasma is generated with a plasma power in the range of about 10 W to about 3000 W. In some embodiments, the plasma is generated with a plasma power less than or equal to about 3000 W, less than or equal to about 2000 W, less than or equal to about 1000 W, less than or equal to about 500 W, or less than or equal to about 250 W.

At operation 718, the processing chamber is optionally purged after exposure to the plasma. Purging the processing chamber in operation 718 can be the same process or different process than the purge in operation 714. Purging the processing chamber, portion of the processing chamber, area adjacent the substrate surface, etc., removes unreacted reactant, reaction products and by-products from the area adjacent the substrate surface.

At decision 720, the thickness of the deposited boron-containing film, or number of cycles of boron-precursor and plasma is considered. If the deposited boron-containing film has reached a predetermined thickness or a predetermined number of process cycles have been performed, the method 700 moves to an optional post-processing operation 730. If the thickness of the deposited film or the number of process cycles has not reached the predetermined threshold, the method 700 returns to operation 710 to expose the substrate surface to the boron precursor again in operation 712 and continuing.

The optional post-processing operation 730 can be, for example, a process to modify film properties (e.g., annealing) or a further film deposition process (e.g., additional ALD or CVD processes) to grow additional films. In some embodiments, the optional post-processing operation 730 can be a process that modifies a property of the deposited film. In some embodiments, the optional post-processing operation 730 comprises annealing the as-deposited film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the film.

The method 700 can be performed at any suitable temperature depending on, for example, the boron precursor, reactant, or thermal budget of the device. In one or more embodiments, the use of high temperature processing may be undesirable for temperature-sensitive substrates, such as logic devices. In some embodiments, exposure to the boron precursor (operation 712) and the plasma (operation 716) occur at the same temperature. In some embodiments, the substrate is maintained at a temperature in a range of about 20° C. to about 400° C., or about 50° C. to about 650° C.

In some embodiments, exposure to the boron precursor (operation 712) occurs at a different temperature than the exposure to the plasma (operation 716). In some embodiments, the substrate is maintained at a first temperature in a range of about 20° C. to about 400° C., or about 50° C. to about 650° C., for the exposure to the boron precursor, and at a second temperature in the range of about 20° C. to about 400° C., or about 50° C. to about 650° C., for exposure the reactant.

In the embodiment illustrated in FIG. 7, at deposition operation 710 the substrate (or substrate surface) is exposed to the boron precursor and the plasma sequentially. In another, un-illustrated, embodiment, the substrate (or substrate surface) is exposed to the boron precursor and the plasma simultaneously in a CVD reaction. In a CVD reaction, the substrate (or substrate surface) can be exposed to a gaseous mixture of the boron precursor and reactant to deposit a boron-containing film having a predetermined thickness. In the CVD reaction, the boron-containing film can be deposited in one exposure to the mixed reactive gas or can be multiple exposures to the mixed reactive gas with purges between.

In some embodiments, the boron-containing film formed comprises elemental boron. Stated differently, in some embodiments, the boron-containing film comprises a metal film comprising boron. In some embodiments, the metal film consists essentially of boron. As used in this manner, the term "consists essentially of boron" means that the boron-containing film is greater than or equal to about 80%, 85%, 90%, 95%, 98%, 99% or 99.5% boron, on an atomic basis. Measurements of the composition of the boron-containing film refer to the bulk portion of the film, excluding interface regions where diffusion of elements from adjacent films may occur.

In other embodiments, the boron-containing film comprises boron carbon (BC) with a carbon content of greater than or equal to about 5%, 7.5%, 10%, 12.5 or 15%, on an atomic basis. In some embodiments, the boron-containing film comprises a carbon content in the range of about 2% to about 30%, or in the range of about 3% to about 25%, or in the range of about 4% to about 20%, on an atomic basis.

In other embodiments, the boron-containing film comprises boron nitride (BN) with a nitrogen content of greater than or equal to about 5%, 7.5%, 10%, 12.5 or 15%, on an atomic basis. In some embodiments, the boron-containing film comprises a nitrogen content in the range of about 2% to about 30%, or in the range of about 3% to about 25%, or in the range of about 4% to about 20%, on an atomic basis.

The deposition operation 710 can be repeated to form one or more of a boron film, a boron carbon film, and a boron nitride film, having a predetermined thickness. In some embodiments, the deposition operation 710 is repeated to provide one or more of a boron film, a boron carbon film, and a boron nitride film having a thickness in the range of about 0.3 nm to about 100 nm, or in the range of about 1 nm to about 15 nm.

One or more embodiments of the disclosure are directed to methods of depositing boron-containing films in high aspect ratio features. A high aspect ratio feature is a trench, via or pillar having a height:width ratio greater than or equal to about 10, 20, or 50, or more. In some embodiments, the boron-containing film is deposited conformally on the high aspect ratio feature. As used in this manner, a conformal film has a thickness near the top of the feature that is in the range of about 80-120% of the thickness at the bottom of the feature.

Some embodiments of the disclosure are directed to methods for bottom-up gapfill of a feature. A bottom-up gapfill process fills the feature from the bottom versus a conformal process which fills the feature from the bottom and sides. In some embodiments, the feature has a first material at the bottom (e.g., silicon oxide) and a second material (e.g., silicon nitride) on the top surface. The boron-containing film deposits selectively on the second material relative to the first material so that the boron film fills the feature in a bottom-up manner.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation, and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed, and unloaded before another substrate is processed. The substrate can also be processed in a continuous manner, similar to a conveyer system, in which multiple substrates are individually loaded into a first part of the chamber, move through the chamber, and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support, and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Example 1

Atomic Layer Deposition of Boron Containing Films

General procedure: A silicon substrate having a layer of silicon oxide on the silicon and a layer of silicon nitride on the silicon oxide is placed in a processing chamber. A boron precursor, $BCl_3$, is flowed into the processing chamber in an atmosphere of a dilution gas, such as helium (He) or argon (Ar), over the silicon substrate leaving a boron-precursor terminated surface. Unreacted precursor and byproducts are then purged out of the chamber. Next, a plasma, $N_2$, is then introduced into the chamber that reacts with the surface-bound boron species. Again, excess plasma and byproducts are removed from the chamber. The resultant material on the substrate is a boron-containing film.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a boron-containing film, the method comprising:
    exposing a device to a boron precursor to deposit a film on the device, the device comprising a substrate, a first material directly on a top surface of the substrate, a second material directly on a top surface of the first material, and at least one feature formed within the first material and the second material, the at least one feature having at least one sidewall comprising the first material and the second material and a bottom surface comprising the first material, the first material comprising one or more of an oxygen containing compound, a metal oxide, carbon, and a nitride, the film selectively depositing on an exposed surface of the second material and not on exposed surfaces of the first material; and
    exposing the device to a plasma to react with the film to form the boron-containing film.

2. The method of claim 1, wherein the boron precursor comprises a boron halide.

3. The method of claim 2, wherein the boron halide is selected from the group consisting of boron trichloride ($BCl_3$), boron trifluoride ($BF_3$), and boron tribromide ($BBr_3$).

4. The method of claim 1, wherein the first material comprises one or more of silicon oxide ($SiO_2$), aluminum oxide ($Al_2O_3$), zirconium oxide ($ZrO_2$), tin oxide ($SnO_x$), hafnium oxide ($HfO_2$), titanium nitride (TiN), tantalum nitride (TaN), and carbon (C).

5. The method of claim 1, wherein the second material comprises one or more of silicon (Si) and silicon nitride (SiN).

6. The method of claim 1, wherein the plasma is selected from one or more of nitrogen ($N_2$), argon (Ar), helium (He), hydrogen ($H_2$), carbon monoxide (CO), carbon dioxide ($CO_2$), methane ($CH_4$), and ammonia ($NH_3$).

7. The method of claim 1, wherein the boron-containing film is selected from one or more of an elemental boron film, a boron nitride film, and a boron carbon film.

8. The method of claim 1, wherein the boron-containing film has a thickness in a range of from about 0.3 nm to about 100 nm.

9. The method of claim 1, further comprising purging the substrate of the boron precursor prior to exposing the substrate to the plasma.

10. The method of claim 9, wherein purging the substrate comprising flowing a purge gas over the substrate.

11. A method of depositing a film, the method comprising:
    exposing a device to a boron precursor to deposit a film on the device, the device comprising a substrate, a first material, at least one feature having at least one sidewall, and a second material directly on a top surface of the substrate, the first material directly on the at least one sidewall and comprising one or more of an oxygen containing compound, a metal oxide, carbon, and a nitride, the boron-containing film selectively depositing on a top surface of the second material adjacent to the first material.

12. The method of claim 11, wherein the boron precursor comprises a boron halide.

13. The method of claim 12, wherein the boron halide is selected from the group consisting of boron trichloride ($BCl_3$), boron trifluoride ($BF_3$), and boron tribromide ($BBr_3$).

14. The method of claim 11, wherein the first material comprises one or more of silicon oxide ($SiO_2$), aluminum oxide ($Al_2O_3$), zirconium oxide ($ZrO_2$), tin oxide ($SnO_x$), titanium nitride (TiN), tantalum nitride (TaN), and carbon (C).

15. The method of claim 11, wherein the second material comprises one or more of silicon (Si) and silicon nitride (SiN).

16. The method of claim 11, wherein the reactant comprises a plasma.

17. The method of claim 16, wherein the plasma is selected from one or more of nitrogen ($N_2$), argon (Ar), helium (He), hydrogen ($H_2$), carbon monoxide (CO), carbon dioxide ($CO_2$), methane ($CH_4$), and ammonia ($NH_3$).

18. The method of claim 11, wherein the boron-containing film is selected from one or more of an elemental boron film, a boron nitride film, and a boron carbon film.

19. The method of claim 11, wherein the boron-containing film has a thickness in a range of from about 0.3 nm to about 100 nm.

* * * * *